United States Patent [19]
Phillips et al.

[11] Patent Number: 5,571,616
[45] Date of Patent: Nov. 5, 1996

[54] ULTRASMOOTH ADHERENT DIAMOND FILM COATED ARTICLE AND METHOD FOR MAKING SAME

[75] Inventors: William Phillips, Belmont; John M. Pinneo, Redwood City, both of Calif.

[73] Assignee: Crystallume, Santa Clara, Calif.

[21] Appl. No.: 442,259

[22] Filed: May 16, 1995

Related U.S. Application Data

[62] Division of Ser. No. 339,989, Nov. 14, 1995, abandoned.

[51] Int. Cl.$^6$ ................................................ C01B 31/06
[52] U.S. Cl. ........................ 428/336; 428/408; 423/446
[58] Field of Search .................................. 428/408, 336; 423/446

[56] References Cited

U.S. PATENT DOCUMENTS

| | | | |
|---|---|---|---|
| 4,919,974 | 4/1990 | McCune et al. | 427/249 |
| 4,961,958 | 10/1990 | Desphandey et al. | 427/38 |
| 4,985,227 | 1/1991 | Ito et al. | 423/446 |
| 5,068,148 | 11/1991 | Nakahara et al. | 428/335 |
| 5,145,711 | 9/1992 | Yamazaki et al. | 427/38 |
| 5,178,645 | 1/1993 | Nakamura et al. | 51/293 |
| 5,183,685 | 2/1993 | Yamazaki | 427/571 |
| 5,230,931 | 7/1993 | Yamazaki et al. | 427/569 |
| 5,234,724 | 8/1993 | Schmidt | 427/530 |
| 5,330,802 | 7/1994 | Yamazaki | 427/577 |
| 5,352,493 | 10/1994 | Dorfman et al. | 427/530 |

FOREIGN PATENT DOCUMENTS 1246361  10/1989  Japan.

OTHER PUBLICATIONS

Saito et al "Adhesion strength of diamond film on cemented carbide insert" Diamond & Related Materials 2(1993) 1391–1395.

Kurihara, et al., "Formation of Functionally Gradient Diamond Films", 1991, Elsevier Science Publishers B.V., pp. 461–466.

*Primary Examiner*—Archene Turner
*Attorney, Agent, or Firm*—D'Alessandro & Ritchie

[57] ABSTRACT

An ultrasmooth diamond film has a thickness greater than about ten microns and an average grain size less than about 0.5 micron. The ultrasmooth diamond film of the present invention is grown using ordinary microwave plasma CVD methods, with a metal vapor source included in the reactor to produce vapor during the growth of the film. The metal vapor source may be chosen from the first row transition elements, chromium, iron, cobalt, and nickel, or from the lanthanides praseodymium, europeum, or erbium. Any metal capable of existing in the vapor phase in the presence of the hydrogen plasma, will cause formation of the ultrasmooth film of the present invention.

1 Claim, 7 Drawing Sheets

ULTRASMOOTH ADHERENT DIAMOND FILM COATED ARTICLE AND METHOD FOR MAKING SAME

CROSS-REFERENCE TO RELATED APPLICATION

This is a division of patent application Ser. No. 08/339,989, filed Nov. 14, 1995, now abandoned.

BACKGROUND OF THE INVENTION

1. Field of the Invention

The present invention relates to diamond-coated articles characterized by superior adhesion of the diamond coating to the article serving as the substrate and to methods for fabricating such diamond-coated articles. More particularly, the present invention relates to articles coated with ultrasmooth diamond films and to fabrication methods for producing such articles.

2. The Prior Art

Diamond films typically exhibit grain-size growth that is proportional to the thickness of the film. Diamond grain size measured looking down at the top surface of the film is typically 10% of the film thicknesses. It is known to circumvent this behavior of thin membranes in diamond deposition processes by using cyclic renucleation, or simply by using high methane concentrations to cause continuous renucleation.

These known processes for forming small-grain-size films generally cannot be used successfully for films having thicknesses greater than a few microns (i.e., thicknesses greater than about ten microns). As nuclei grow during the deposition process, competitive interaction occurs between the nuclei causing the larger ones to get larger and the smaller ones to die out.

Small-grain-size films having thicknesses greater than are available using prior-art growth techniques could be extremely useful if applied to numerous applications, such as tooling inserts or other tools. The small grain size would provide a smooth film without the need to perform a polishing step subsequent to deposition. Such films could also enhance the ability to maintain sharp corners, increasing the value and applications of coated tools and other diamond film products.

In addition, one of the recurring problems in diamond coated tools is the delamination of the diamond coating from the substrate material due to the forces exerted on the tools in the machining environment. The problem of ensuring sufficient adhesion between the diamond film and the underlying substrate material has been a major stumbling block in the development of diamond coated tools.

It is therefore an object of the present invention to provide a small-grain-size diamond film having a thickness greater than is possible with prior art small-grain-size diamond films.

It is another object of the present invention to provide a process for growing a small-grain size diamond film to a thickness greater than is possible with prior art small-grain size diamond films.

It is yet another object of the present invention to provide a diamond coated tool comprising a tool substrate material coated with a small-grain-size diamond film having improved adhesion.

BRIEF DESCRIPTION OF THE INVENTION

The present Invention relates to diamond films which have thicknesses greater than about 10 microns, preferably 150 microns or more, and which are characterized by extremely small submicron grain size, i.e., less than about 0.5 micron. Films according to the present invention having this property and a thickness closer to ten microns are extremely useful when applied to numerous applications, such as tooling inserts or other tools. The small grain size provides a smooth film without the need to polish the finished diamond surface subsequent to deposition. It also enhances the ability to maintain sharp corners, increasing the value and applications of coated tools.

The ultra-smooth diamond films of the present invention may be made by ordinary microwave plasma CVD methods, with a metal or silicon vapor source included in the reactor to produce vapor during the growth of the film. The metal may be chosen from the first row transition elements, chromium, iron, cobalt, and nickel, or from the lanthanides praseodymium, europeum, or erbium. The metals indicated herein, when present in the vapor phase in the presence of the hydrogen plasma, will cause formation of the ultrasmooth film of the present invention. It is likely that many other metals could be employed in the present invention to cause the formation of the ultrasmooth film of the present invention. The metal vapor may be formed by heating a solid source, or by introducing an organometallic or other compound into the gas feed.

The submicron grain size diamond film of the present invention may be deposited on a substrate according to another aspect of the present invention to form a diamond-coated tool or other article. The adhesion strength of the diamond coated tool or other article according to the present invention is enhanced by employing a substrate material having a surface characteristic such that micro level re-entrant cavities are formed in which the diamond coating and underlying substrate material are interlocked together. According to one particular embodiment of the present invention, a tungsten carbide substrate including tungsten carbide particles which are acicular in shape is used.

According to yet another aspect of the present invention an adherent bond between a diamond film and a second material may be obtained by first growing a conventional diamond film having a rough surface characteristic. A plurality of re-entrant cavities are then formed in the surface of the diamond film by masking and isotropic etching techniques. A layer of the second material is then formed over the surface of the diamond film by means such as chemical vapor deposition, physical vapor deposition, or plating by electroless or electroplating techniques. Portions of the second material fill the re-entrant cavities and form mechanical interlocking structures between the diamond film and the second material.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to a first aspect of the present invention, an ultrasmooth CVD diamond film and method for growing such a film are disclosed. Ultrasmooth diamond films like those of the present invention are unknown in the prior art.

Figure 1:
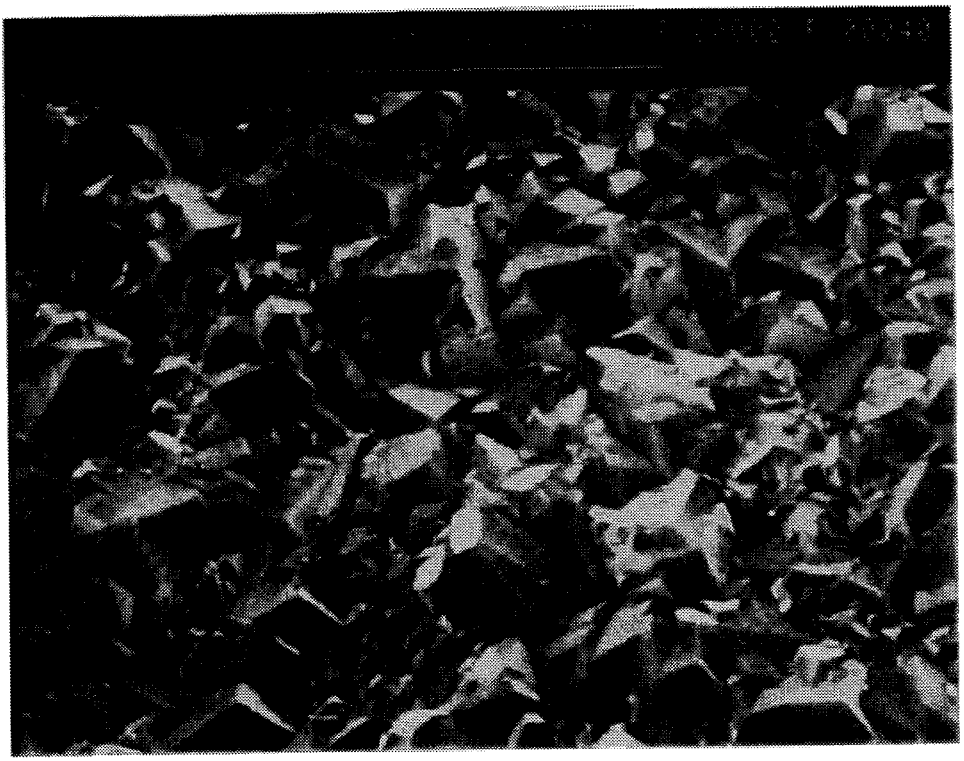
FIG. 1 is an SEM photograph of the surface of a typical CVD diamond film approximately 44 microns thick, illustrating the roughness inherent in diamond films grown by typical CVD processes.

Referring first to FIG. 1, a SEM photograph of the surface of a typical CVD diamond film is shown. The diamond film in FIG. 1 is approximately 44 microns thick, and illustrates the roughness inherent in diamond films grown by typical CVD processes. The grain size of the film shown in FIG. 1 is about 4 microns.

Figure 2:
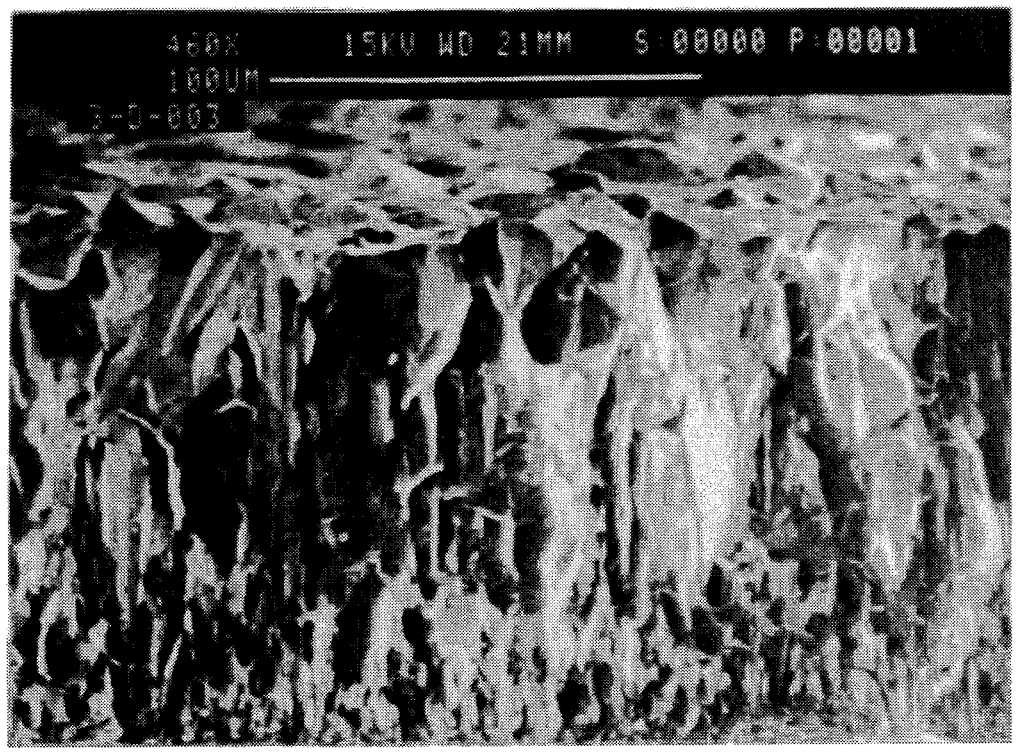
FIG. 2 is an SEM photograph showing an edge view of a conventional CVD diamond film illustrating the columnar growth structure responsible for large grain size.

FIG. 2 is an edge view of a conventional CVD diamond film like that of FIG. 1 and illustrates the columnar growth responsible for the large grain size exhibited by such films. The film thickness portrayed in FIG. 2 is about 110 microns.

Figure 3:
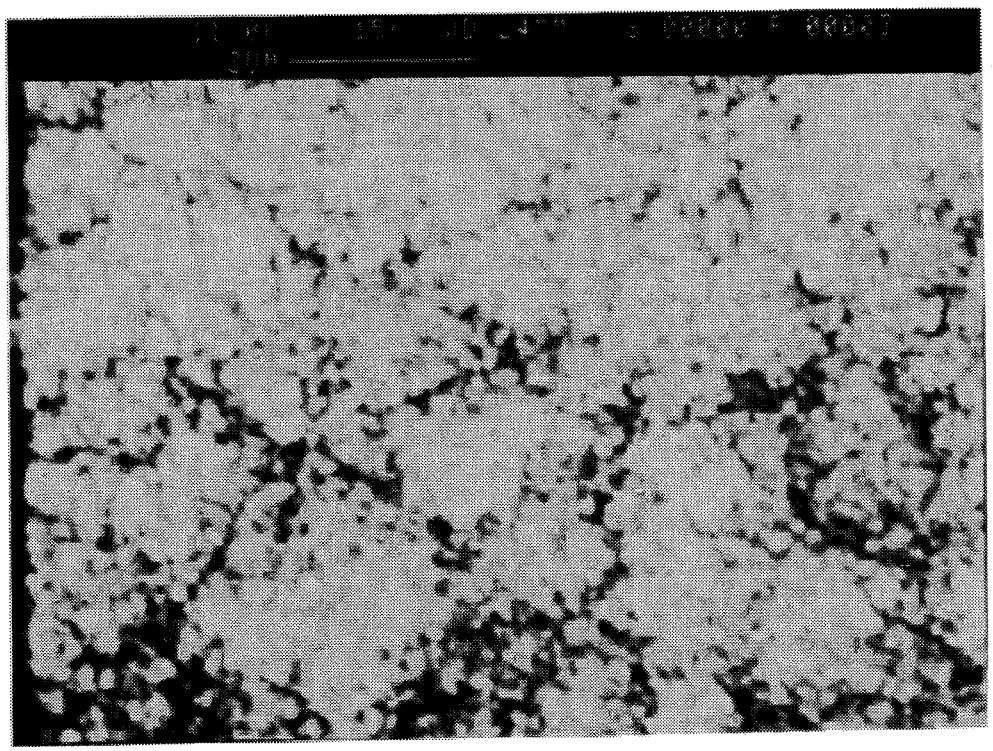
FIG. 3 is an SEM photograph of an ultrasmooth CVD diamond film approximately 67 microns thick, grown according to the present invention.
Figure 4:
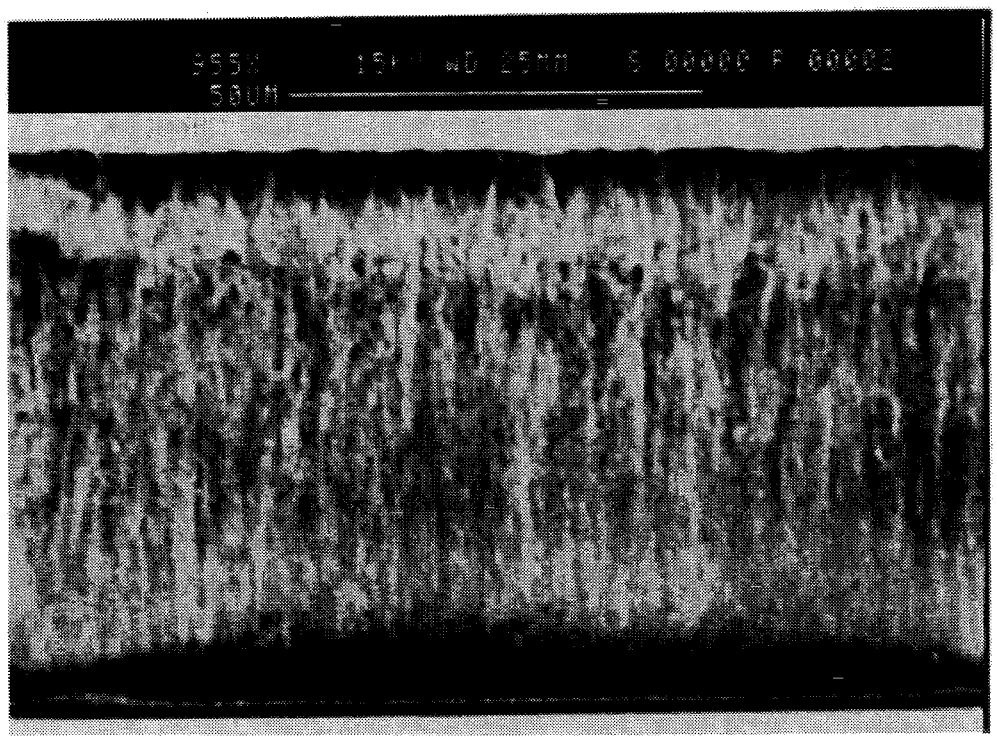
FIG. 4 is an SEM photograph showing an edge view of a CVD diamond film grown according to the present invention, illustrating the growth structure responsible for the nanocrystalline grain size.

FIG. 3 is a SEM photograph of an ultrasmooth CVD diamond film approximately 67 microns thick, grown according to the present invention. The grain size of the diamond film shown in FIG. 3 is about 250 nanometers. FIG. 4 is an edge view of a CVD diamond film according to the present invention like the film of FIG. 3, illustrating the growth mechanism responsible for the nanocrystalline grain size of the film. The film thickness portrayed in FIG. 3 is about 66 microns. Comparison of FIGS. 1 and 2 on the one hand with FIGS. 3 and 4 on the other hand clearly show the difference between the ultrasmooth diamond films of the present invention and the prior-art diamond films.

The ultra-smooth diamond films of the present invention may be made by ordinary microwave plasma CVD diamond-growth methods, with the novel feature that a metal vapor source is included in the reactor to produce vapor during the growth of the film. It is presently understood that the metals can be chosen from the first row transition elements, chromium, iron, cobalt, and nickel, or from the lanthanides praseodymium, europeum, or erbium. Any metal capable of existing in the vapor phase in the presence of the hydrogen plasma, may cause formation of the ultrasmooth film of the present invention. Initial experiments have been performed successfully with chromium and with praseodymium as the source metals. Since the ionic radius and other properties of these two metals are so different, it is suggested that other metals, as well as silicon, could be employed in the present invention.

Thus, according to the present invention, a substrate material upon which an ultrasmooth diamond layer will be deposited is prepared using known substrate preparation techniques. The prepared substrate is positioned in a CVD diamond reactor. The reactor is sealed and the pressure adjusted to a value suitable for diamond deposition. Reactant gasses are introduced into the reactor at suitable flow rates. Microwave energy is used to ignite a plasma or current is passed through a filament if hot filament deposition is to be performed. The metal vapor source is activated. The metal vapor source can be activated by heating the metal with a filament or by positioning the metal so it is heated by the plasma. The metal vapor may also be provided by injecting the appropriate organometallic or other vapor phase compound, for example silicon, into the reactor. Those of ordinary skill in the art will readily recognize that there are various different methods for introducing the vapor phase metal or compound into the reactor, and as such, the present invention is not limited by the methods so described for introducing the vapor phase metal or compound into the reaction chamber. Diamond deposition then proceeds for a time sufficient to grow a diamond film of the desired thickness. After the diamond film reaches the desired thickness, the deposition is stopped, the chamber is vented to the atmosphere, and the coated substrate is removed from the chamber.

According to the present invention, the ultra-smooth diamond films have thicknesses greater than about 10 microns, preferably 150 microns or more, and are characterized by extremely small submicron grain size, i.e., less than about 0.5 micron. Small grain size diamond films made using prior-art cyclic renucleation processes are characterized by a layered appearance, because the diamond grain size increases until each renucleation layer is encountered, wherein the grain size abruptly decreases and begins to increase again. In contrast, the diamond films made according to the present invention have substantially similar average grain size throughout their thickness.

In one microwave CVD diamond growth process carried out according to the present invention, a growth rate of 1.5 microns per hour was maintained. The process produced a free-standing diamond film specimen having a thickness of 150 microns and an average grain size of less than one micron. The appearance of the as-grown surface was dull metallic gray.

Ultrasmoothness is just one property of the new films of the present invention. They may have useful electrical, optical or other properties as well, which would arise from the small grain size. Examples of such properties include enhanced fracture toughness, and a wider range of controllable electronic properties.

An additional feature of this invention is that the method for producing these films unexpectedly allows high growth rates to be maintained. Typical prior-art diamond films grown with small grain size grow at slower rates than larger grain films. For example, thin, smooth diamond film membranes grown using cyclic renucleation typically have a growth rate of 0.1 microns per hour. In contrast, the diamond films prepared according to the present invention were grown at rates of approximately 1.5 microns per hour.

Thin diamond films grown by cyclic renucleation have a similar microstructure to the thicker small grain size films of the present invention, but they are limited in overall thickness, i.e., they cannot be grown to thicknesses exceeding about 5 microns without compromising surface smoothness due to formation of large grains. Thus, the small grain size diamond films of the present invention provide a great advantage over thinner prior-art small grain size diamond films.

The ultrasmooth diamond films of the present invention may be advantageously employed as coatings in tooling applications. An important aspect of such applications is the strength of the adhesion of the diamond-film coating to the tool substrate. A large percentage of diamond-coated tool failures are caused by delamination of the diamond coating from the tool substrate.

According to the present invention, the ultrasmooth diamond films of the present invention may be micro-mechanically interlocked to features on the surface of the substrate material. By growing the ultrasmooth diamond film on the surface of such a substrate, a diamond-coated tool having superior resistance to delamination is produced.

Figure 5:
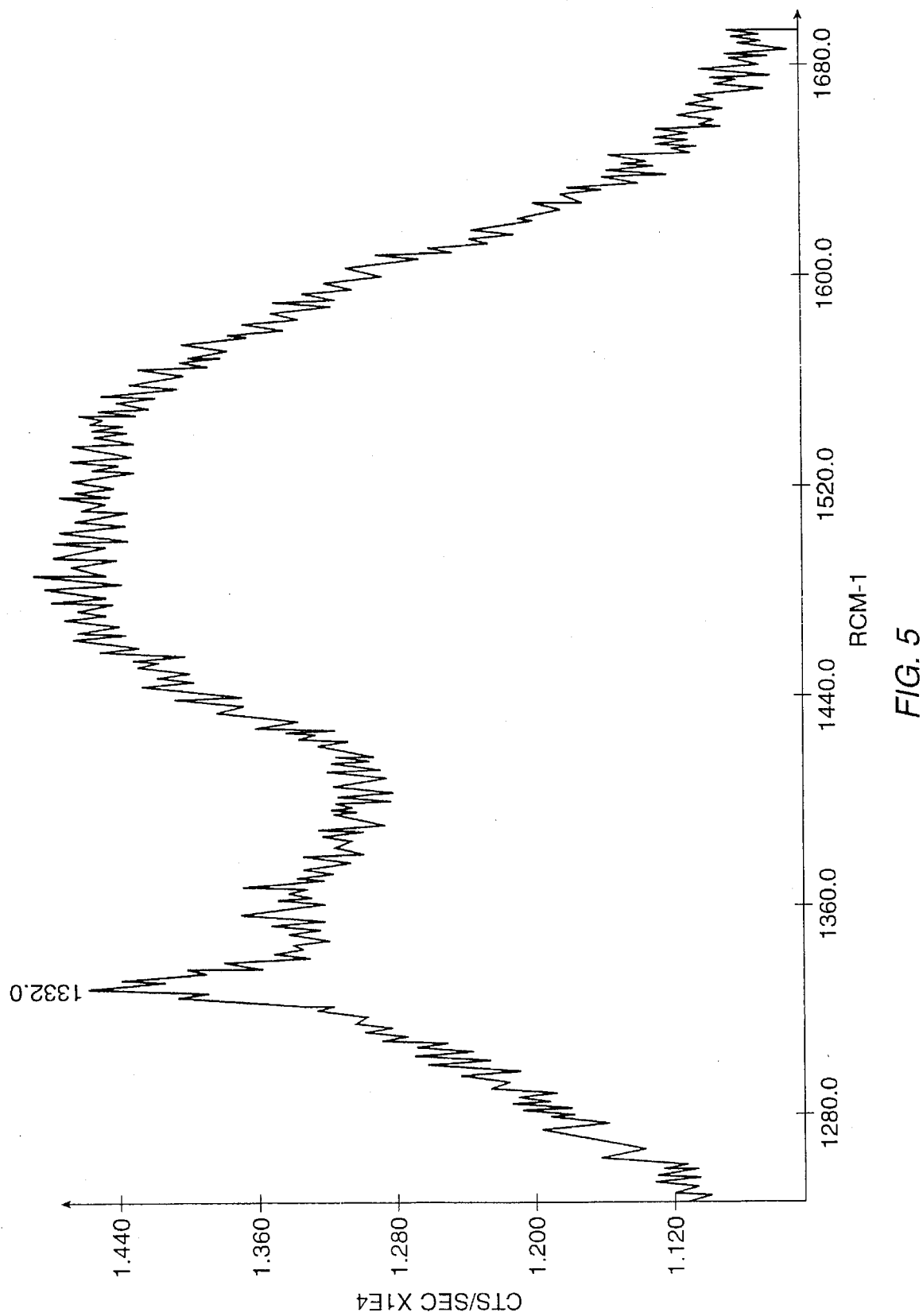
FIG. 5 is a Raman spectrum of an ultrasmooth CVD diamond film grown according to the present invention.

FIG. 5 is a Raman spectrum of an ultrasmooth CVD diamond film grown according to the present invention. In comparing the Raman spectrum of the diamond film of the present invention with other ultrasmooth carbon films, for example diamond like carbon (DLC) films which have smooth surfaces and layerless structures, some important features may be noted. DLC films do not show the $sp^3$ (diamond) bonded carbon peak in their Raman spectra, but do show broad peaks at ~1340–1350 $cm^{-1}$ corresponding to amorphous or disordered carbon bonds and a broad peak from approximately 1440 to approximately 1600 $cm^{-1}$ corresponding to $sp^2$, or graphitically bonded carbon.

In contrast, the ultrasmooth films of the present invention show a distinct, well-ordered $sp^3$ Raman peak at approximately 1332 $cm^{-1}$, as shown in FIG. 5, indicating the presence of diamond-bonded carbon. The graphitic Raman spectral components result from a phenomenon well-known to those of ordinary skill in the art, wherein non-diamond phases of carbon formed during the deposition of diamond films by chemical vapor deposition methods preferentially segregate into the volume of material residing at the boundaries between individual diamond crystallites. Thus, large-grained diamond films, having relatively little intergranular material, exhibit very weak or nonexistent graphitic Raman features. In comparison, the ultrasmooth diamond films of the present invention, having a very small average diamond crystallite size, necessarily have a greater volume fraction of the intergranular material, and therefore exhibit stronger graphitic Raman spectral components.

The different features found in comparing the Raman spectrum of the present invention and ultrasmooth DLC films are mirrored in various functional properties. For example, the non-$sp^3$ films exhibit poor thermal conductivity, while the ultrasmooth films made according to the present invention exhibit conductivity typical of true diamond films.

Figure 6:
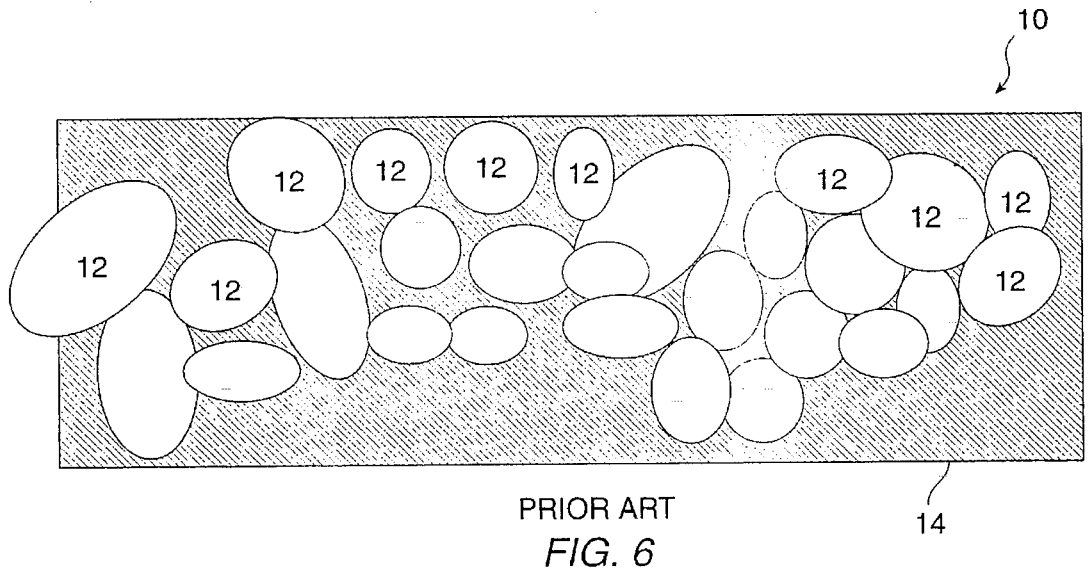
FIG. 6 is a schematic representation of a cross sectional view of a typical prior-art tungsten carbide substrate material.

FIG. 6 is a schematic representation of a cross sectional view of a typical prior-art tungsten carbide substrate material 10. Substrate material 10 comprises a plurality of rounded tungsten carbide grains (illustrative ones of which are identified by reference numerals 12) cemented together with cobalt binder 14. The use of rounded tungsten carbide grains 12 is preferred in the prior art because it increases tool fracture toughness.

Figure 7:
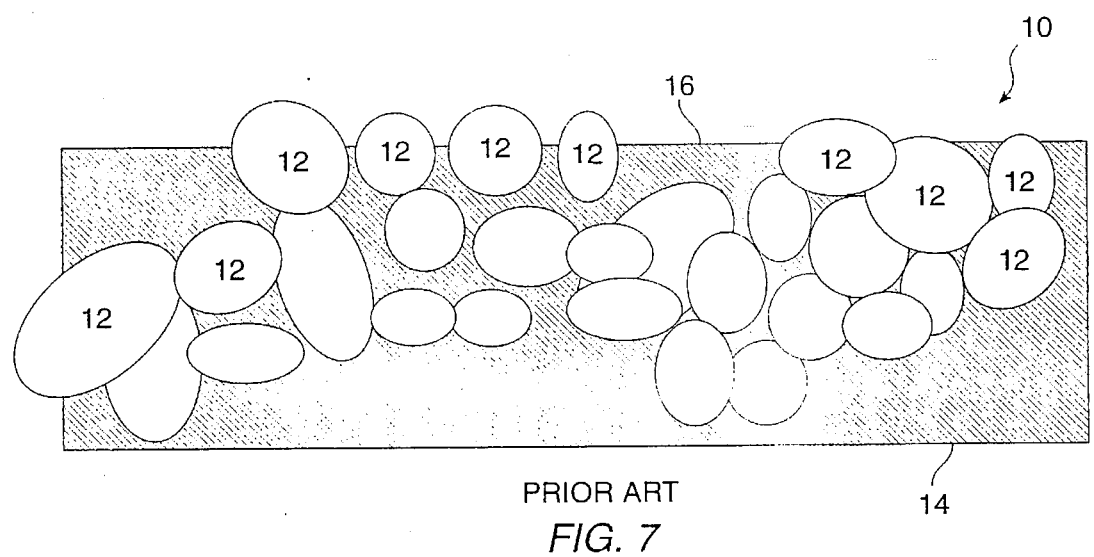
FIG. 7 is a schematic representation of a cross sectional view of the substrate material of FIG. 6 after substrate preparation by etching.

In typical diamond deposition processes, the surface of the substrate material 10 is prepared by etching to deplete the cobalt concentration at the surface of the substrate material 10. FIG. 7 is a schematic representation of a cross sectional view of the substrate material 10 of FIG. 6 after substrate preparation by etching to deplete a region of cobalt at the substrate surface 16 and to expose some of the rounded tungsten carbide grains 12. Diamond material 18 is then deposited on the surface of the substrate, resulting in a structure similar to that schematically represented in FIG. 8.

Figure 8:
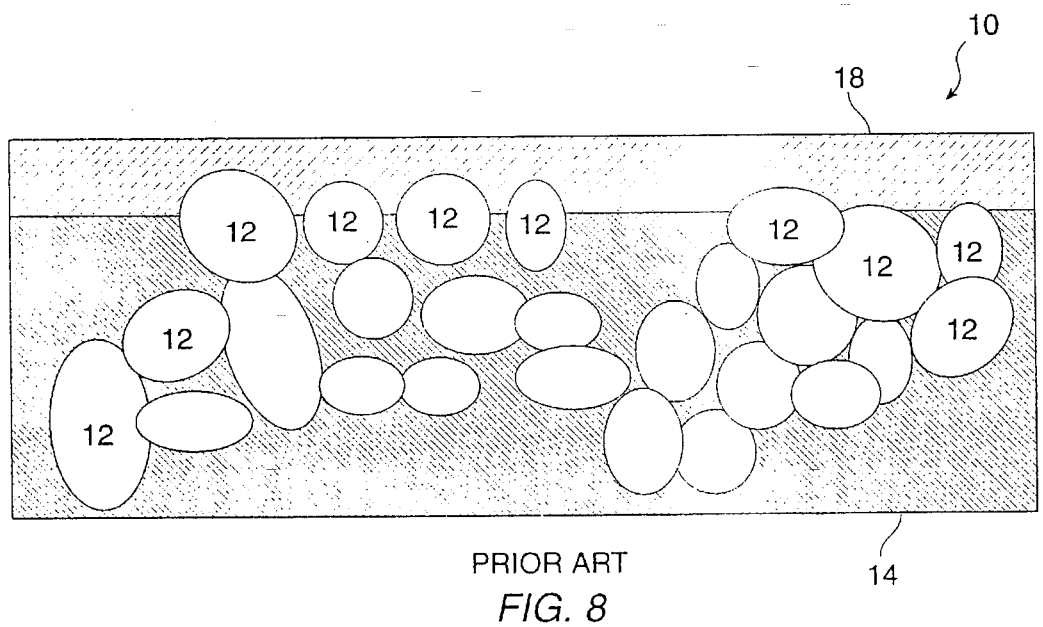
FIG. 8 is a schematic representation of a cross sectional view of a prior-art diamond film grown on an etched tool surface such as that of FIG. 6.
Figure 9:
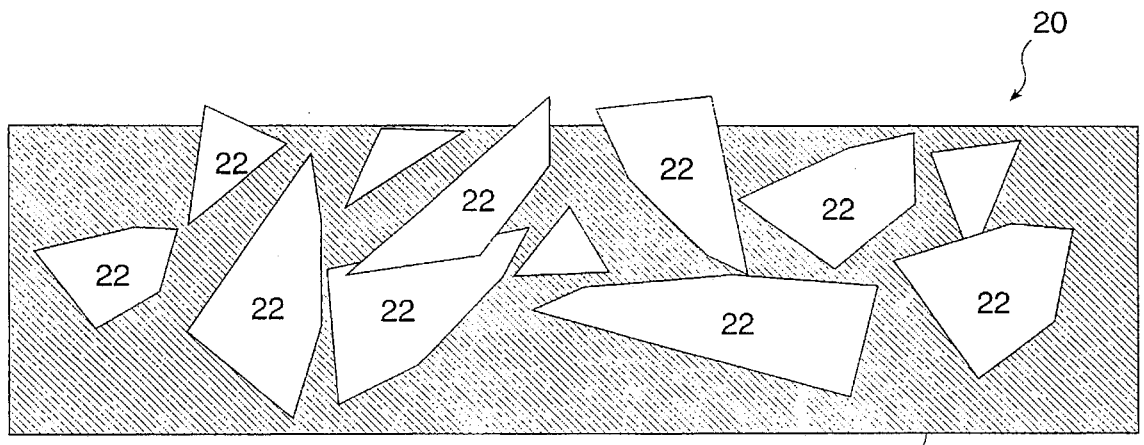
FIG. 9 is a schematic representation of a cross sectional view of a cobalt-consolidated tungsten carbide tooling material according to the present invention.

There is a crucial difference between the diamond-coated tools of the prior art represented in FIG. 8 and the diamond-coated tools of the present invention. FIG. 9 is a schematic representation of a cross sectional view of a cobalt-consolidated tungsten carbide substrate material 20 according to the present invention. Like the prior-art cobalt-consolidated tungsten carbide substrate material 10 of FIG. 6, the cobalt-consolidated tungsten carbide substrate material 20 according to the present invention comprises a plurality of tungsten carbise grains disposed in a binder material. The major structural difference between the substrate material of the prior art and the substrate material of FIG. 9 is the tungsten carbide grains (illustrative ones of which are identified by reference numerals 22) in cobalt binder 24 of the substrate of FIG. 9 are acicular in shape in contrast to the rounded tungsten carbide grains 12 of the prior art substrate shown in FIGS. 6, 7, and 8. This structural difference is advantageously employed in the present invention.

Figure 10:
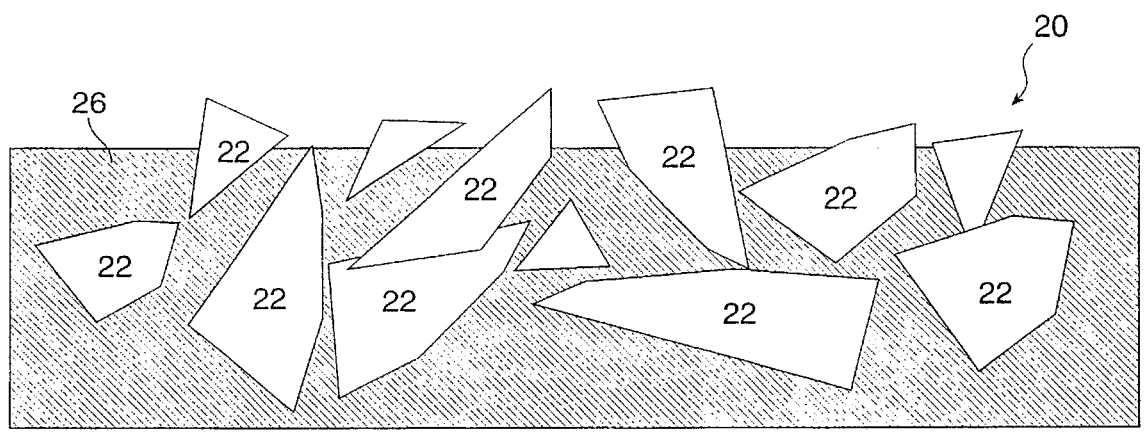
FIG. 10 is a schematic representation of a cross-sectional view of an etched surface of the cobalt-consolidated tungsten carbide tooling material of FIG. 9 showing exposed tungsten carbide particles protruding from the surface of the material.

FIG. 10 is a schematic representation of a cross-sectional view of the surface 26 of the cobalt-consolidated tungsten carbide substrate material 20 of FIG. 8 after etching. Typical etching agents used to etch the surface material 26 of substrate material 20 include Murikami's reagent and sulfuric-peroxide reagents. FIG. 10 shows a plurality of exposed acicular tungsten carbide grains 22 protruding from the surface 26 of the cobalt binder 24 material.

Figure 11:
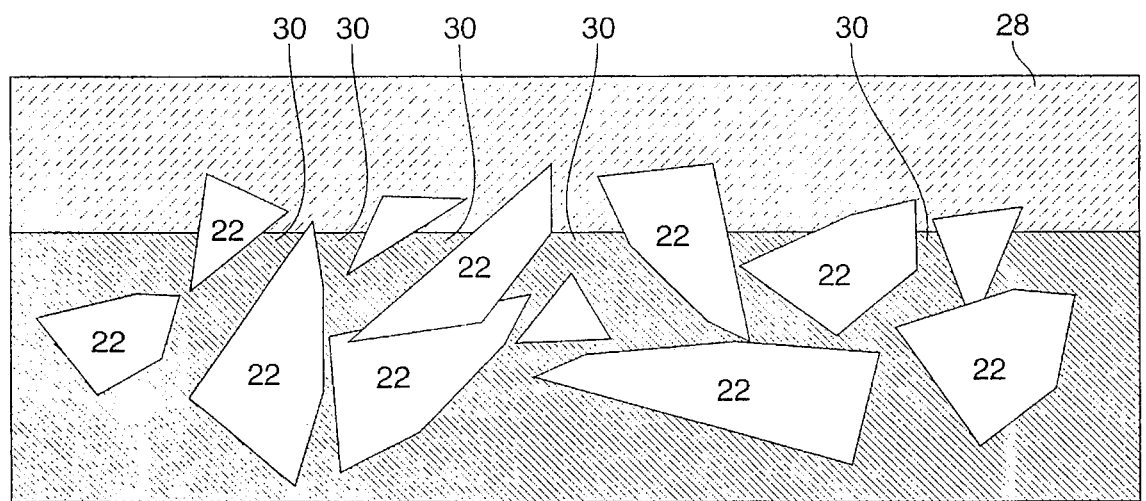
FIG. 11 is a schematic representation of a cross sectional view of a diamond film according to the present invention grown on an etched tool surface such as that of FIG. 10, wherein the diamond film is locked to exposed tungsten carbide grains.

FIG. 11 is a schematic representation of a cross sectional view of a diamond film 28 according to the present invention grown on an etched substrate surface 26 such as that of FIG. 10. As may be seen from an examination of FIG. 11, the diamond film is locked to microscopic re-entrant cavities 30 formed by the acicular exposed tungsten carbide grains 22. The rounded shape of the tungsten carbide grains 12 of the prior art substrate material 10 are not conducive to the formation of such re-entrant cavities 30. The structure represented by FIG. 11 provides superior adhesion of the diamond film 28 to the substrate material 20.

Those of ordinary skill in the art will recognize that the features of FIGS. 6 through 11 are not to scale and have been significantly enlarged for the purposes of illustration of the micro-mechanical interlocking of the diamond film 28 and the substrate material 20 according to the present invention. The actual feature size of the micro-mechanical interlocking structures of the present invention is from about 0.1 to about 20 microns.

According to another aspect of the present invention, non-diamond materials may be adherently deposited onto the surface of an existing diamond film. Superior adhesion between the non-diamond material and the diamond substrate material is achieved by creating re-entrant cavities in the surface of the diamond film into which the deposited non-diamond material interlocks.

Figure 12:
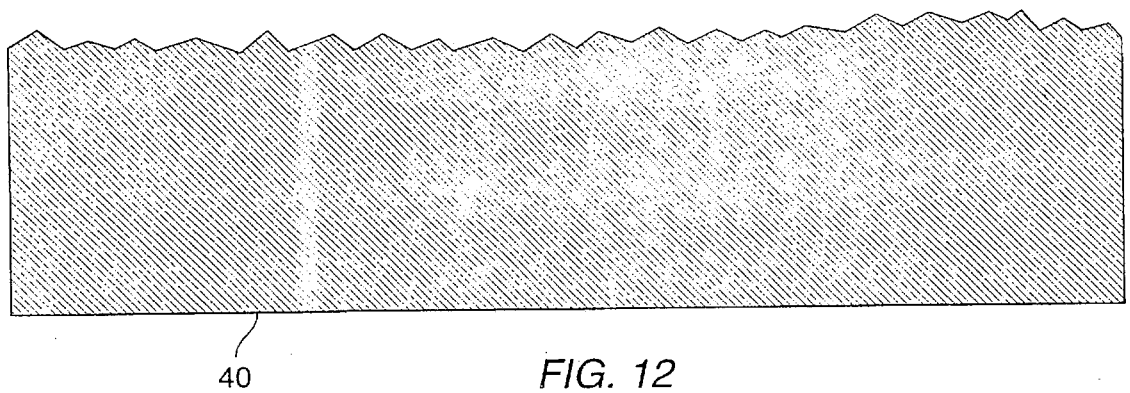
FIG. 12 is a schematic representation of a typical diamond film showing the top surface thereof.

FIG. 12 is a schematic representation of a typical diamond film 40 showing the top surface thereof. Non-diamond material can be deposited directly on the upper surface of diamond film, but the adhesion between the diamond material and the non-diamond material will not be optimum.

Figure 13:
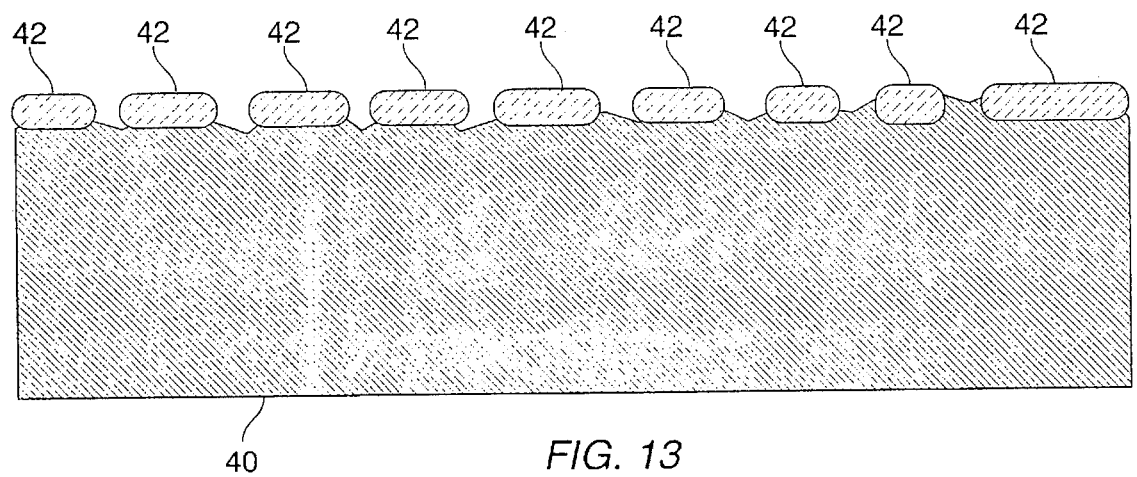
FIG. 13 is a schematic representation of the diamond film of FIG. 12 after masking and during an isotropic etching step.

According to the present invention, a plurality of re-entrant cavities are formed into the upper surface of diamond film using photolithographic and etching techniques similar to those employed in the semiconductor industry. First, as shown in FIG. 13, a masking layer 42, comprising a material such as silicon dioxide, is applied to the upper surface of diamond film 40. Masking layer 42 may be applied using CVD techniques. Masking layer 42 has a plurality of apertures through which an etching step will be performed. A typical arrangement for masking layer 42 is to have apertures having an average feature size of between about 1 micron and 5 microns separated by a distance of between about 10 microns and about 50 microns.

After masking layer 42 is applied to the upper surface of diamond film 40, an isotropic etching step iS performed to create a plurality of re-entrant cavities in the surface of diamond material. FIG. 13 is a schematic representation of the diamond film of FIG. 12 after masking. Any one of a number of known etching processes, such as oxygen plasma, may be employed in the present invention.

Figure 14:
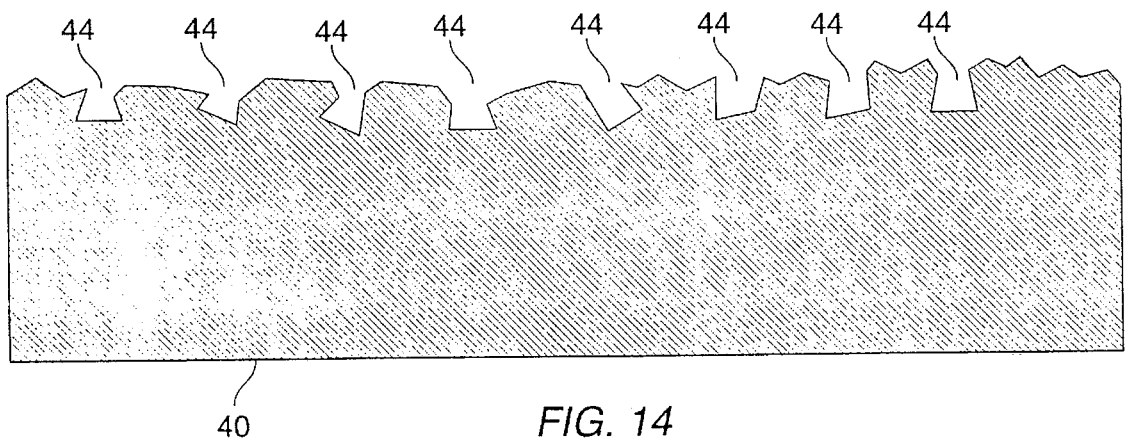
FIG. 14 is a schematic representation of the diamond film of FIG. 13 after completion of the isotropic etching process and removal of the masking material.

As shown in FIG. 14, after the etching step has been completed, re-entrant cavities 44 have been formed in the upper surface of diamond film 40. Typical depths for the re-entrant cavities 44 are in the range of from about 1 micron to about 10 microns. As will be appreciated by those of ordinary skill in the art, the etching time will depend upon the etching agent employed. The masking layer 42 is then removed from upper surface of diamond material. As an example, where silicon dioxide is used as the masking layer 42, it may be removed by use of an etchant solution comprising $HF/HNO_3$ as is known in the art. FIG. 14 is a schematic representation of the diamond film 40 after completion of the etching process and removal of the masking layer 42.

Figure 15:
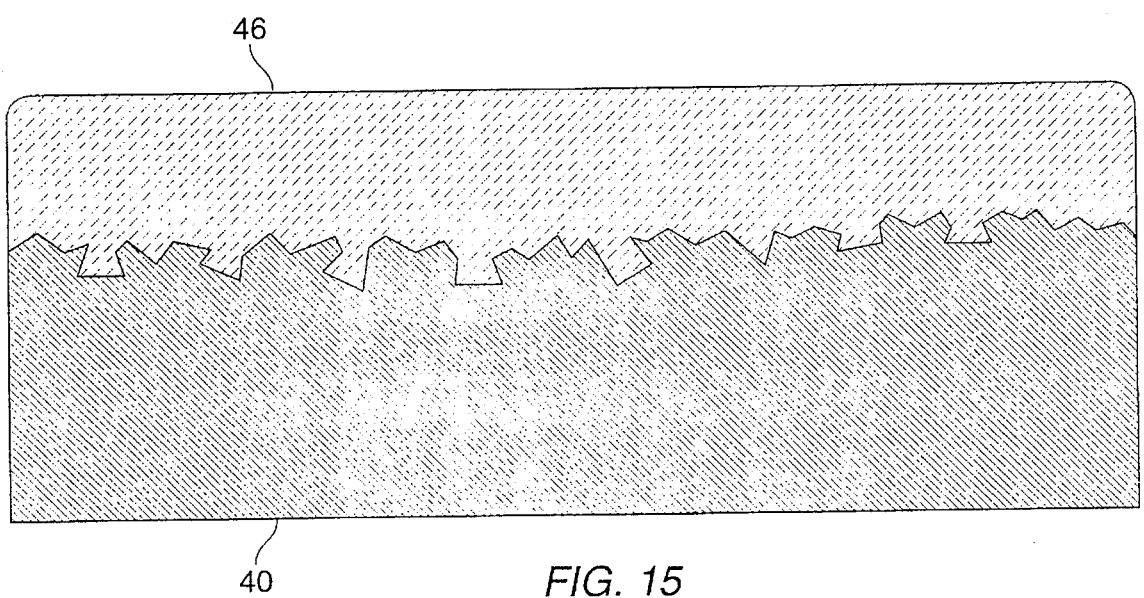
FIG. 15 is a schematic representation of the diamond film of FIG. 14 after deposition of a non-diamond material onto the top surface thereof.

FIG. 15 is a schematic representation of the diamond film 40 of FIG. 14 after deposition of a non-diamond material 46 onto the top surface thereof. Non-diamond material 46 may be any one of a number of materials which can be deposited by techniques such as chemical vapor deposition, physical vapor deposition, or plating by electroless or electroplating techniques. For example, nickel may be applied using standard electroless methods. Tungsten may be applied using standard CVD techniques.

As may be seen from an examination of FIG. 15, the non-diamond material 46 is well adhered to the surface of the diamond film 40 because of the presence of the re-entrant cavities into which the non-diamond material protrudes. The structure of FIG. 15 provides superior adhesion when compared with prior-ad deposition techniques.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A synthetic diamond film having a grain size less than about 0.5 micron and a thickness greater than about 10 microns.

\* \* \* \* \*

UNITED STATES PATENT AND TRADEMARK OFFICE
CERTIFICATE OF CORRECTION

PATENT NO. : 5,571,616
DATED : November 5, 1996
INVENTOR(S) : William Phillips and John M. Pinneo It is certified that error appears in the above-indentified patent and that said Letters Patent is hereby corrected as shown below:

Column 1, line 7: replace "1995" with --1994--.

Column 2, line 2: replace "Invention" with --invention--.

Column 4, line 20: replace "plasma," with --plasma--.

Column 6, line 39: replace "carbise" with --carbide--.

On the title page, item [56],
             "OTHER PUBLICATIONS":

Replace "Saito" with --Suito--.

Signed and Sealed this

Fourth Day of March, 1997

Attest:

BRUCE LEHMAN

*Attesting Officer*    Commissioner of Patents and Trademarks